(12) United States Patent
Nakajima

(10) Patent No.: US 9,076,502 B2
(45) Date of Patent: Jul. 7, 2015

(54) NON-VOLATILE MEMORY DEVICE

(71) Applicant: Kabushiki Kaisha Toshiba, Minato-ku (JP)

(72) Inventor: Hiroomi Nakajima, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/199,041

(22) Filed: Mar. 6, 2014

(65) Prior Publication Data

US 2015/0036407 A1  Feb. 5, 2015

(30) Foreign Application Priority Data

Jul. 30, 2013  (JP) ................................ 2013-157577

(51) Int. Cl.

| G11C 5/06 | (2006.01) |
|---|---|
| H01Q 1/22 | (2006.01) |
| H01L 23/522 | (2006.01) |
| H01L 27/06 | (2006.01) |
| H01L 27/115 | (2006.01) |
| H01L 49/02 | (2006.01) |
| H01L 29/792 | (2006.01) |
| G11C 16/04 | (2006.01) |

(52) U.S. Cl.
CPC .............. *G11C 5/063* (2013.01); *H01Q 1/2283* (2013.01); *G11C 16/0483* (2013.01); *H01L 23/5227* (2013.01); *H01L 27/0629* (2013.01); *H01L 27/11531* (2013.01); *H01L 27/11548* (2013.01); *H01L 27/11556* (2013.01); *H01L 27/11573* (2013.01); *H01L 27/11575* (2013.01); *H01L 27/11582* (2013.01); *H01L 28/10* (2013.01); *H01L 29/7926* (2013.01)

(58) Field of Classification Search
CPC ...... G11C 5/06; G11C 5/063; G11C 16/0483; H01Q 1/2283; H01L 29/7926; H01L 27/11548; H01L 27/11575; H01L 27/0629; H01L 23/5227; H01L 28/10; H01L 27/11531; H01L 27/11573; H01L 27/11582; H01L 27/11556

See application file for complete search history.

(56) References Cited

U.S. PATENT DOCUMENTS

| 6,541,841 | B2 | 4/2003 | Maeda et al. | |
|---|---|---|---|---|
| 7,838,993 | B2 * | 11/2010 | Aoki et al. | 257/773 |
| 7,961,503 | B2 * | 6/2011 | Jin et al. | 365/158 |
| 8,564,093 | B2 * | 10/2013 | Kuroda | 257/531 |
| 2010/0127937 | A1 | 5/2010 | Chandrasekaran et al. | |

FOREIGN PATENT DOCUMENTS

| JP | 6-61058 | 3/1994 |
|---|---|---|
| JP | 2001-352039 | 12/2001 |
| JP | 2012-509653 | 4/2012 |

\* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

According to one embodiment, a non-volatile memory device includes a memory cell array and a coil provided closely to the memory cell array. The memory cell array includes memory cells provided above an underlying layer, and a first interconnection. The memory cells are aligned in a first direction perpendicular to the underlying layer. The first interconnection extends in a second direction perpendicular to the first direction. The coil includes a winding including a second interconnection extending in the second direction and sharing a central axis with the first interconnection, a first plug extending in the first direction and connected to the second interconnection, a third interconnection electrically connected to another end of the first plug and extending in a direction parallel to the underlying layer, and a second plug having one end electrically connected to the third interconnection, and extending in a direction opposite to the first direction.

20 Claims, 11 Drawing Sheets

NON-VOLATILE MEMORY DEVICE

CROSS-REFERENCE TO RELATED APPLICATIONS

This application is based upon and claims the benefit of priority from Japanese Patent Application No. 2013-157577, filed on Jul. 30, 2013; the entire contents of which are incorporated herein by reference.

FIELD

Embodiments described herein relate generally to a non-volatile memory device.

BACKGROUND

A consideration has been made on a system that uses microwave communication in transferring signals between LSI chips or within a chip. For example, signals are transferred between a central processing unit (CPU) that processes information and a non-volatile memory device that stores information via a microwave. To achieve this signal transfer, however, an inductor needs to be provided in the non-volatile memory device. The inductor is a circuit element, but also serves as an antenna for transmitting and receiving radio waves. This makes it difficult to reduce the size of the inductor, thus resulting in enlargement of the chip size of the non-volatile memory device and reducing the storage capacity.

DETAILED DESCRIPTION

Figure 1:
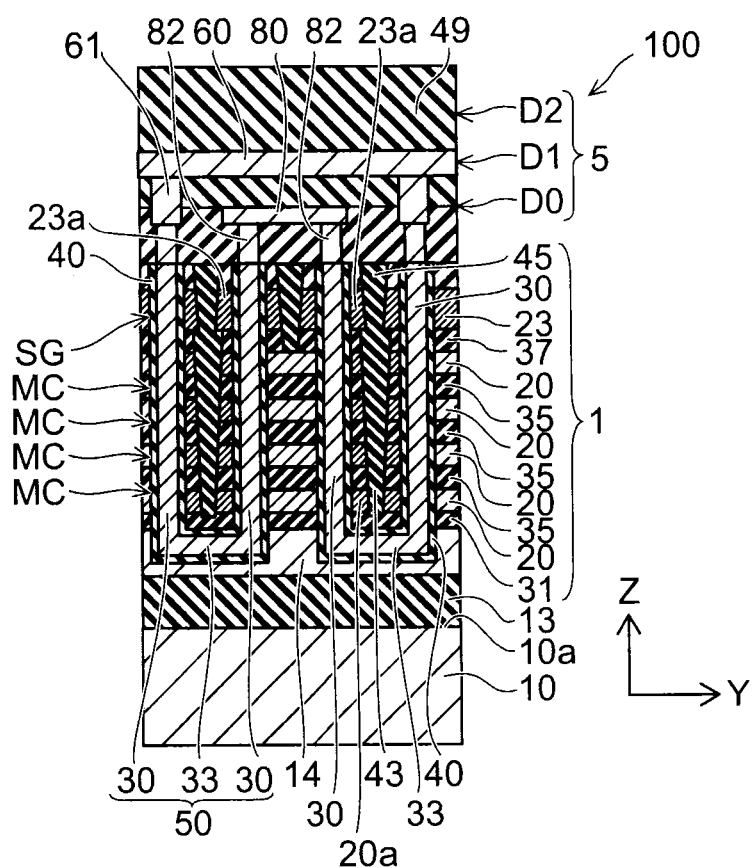
FIG. 1 is a schematic cross-sectional view showing a non-volatile memory device 100 according to an embodiment.

According to one embodiment, a non-volatile memory device includes a memory cell array and a coil provided closely to the memory cell array. The memory cell array includes a plurality of memory cells provided above an underlying layer, and at least one first interconnection. The memory cells are aligned in a first direction perpendicular to the underlying layer. The first interconnection extends in a second direction perpendicular to the first direction, and is configured to control an operation of one of the memory cells. The coil includes at least one winding. The winding includes a second interconnection extending in the second direction and sharing a central axis in the second direction with the first interconnection, a first plug extending in the first direction and having one end connected to the second interconnection, a third interconnection electrically connected to another end of the first plug and extending in a direction parallel to the underlying layer, and a second plug having one end electrically connected to the third interconnection, and extending in a direction opposite to the first direction.

Various embodiments will be described hereinafter with reference to the accompanying drawings. The same numerals are applied to constituents that have already appeared in the drawings, and repetitious detailed descriptions of such constituents are omitted. Note that the drawings are schematic or simplified illustrations, and a relationship between thicknesses and width of parts and proportions in size between parts may differ from actual parts. Also, even where identical parts are depicted, mutual dimensions and proportions may be illustrated differently depending on the drawing.

FIG. 1 is a schematic cross-sectional view showing a non-volatile memory device 100 according to an embodiment.

Figure 2:
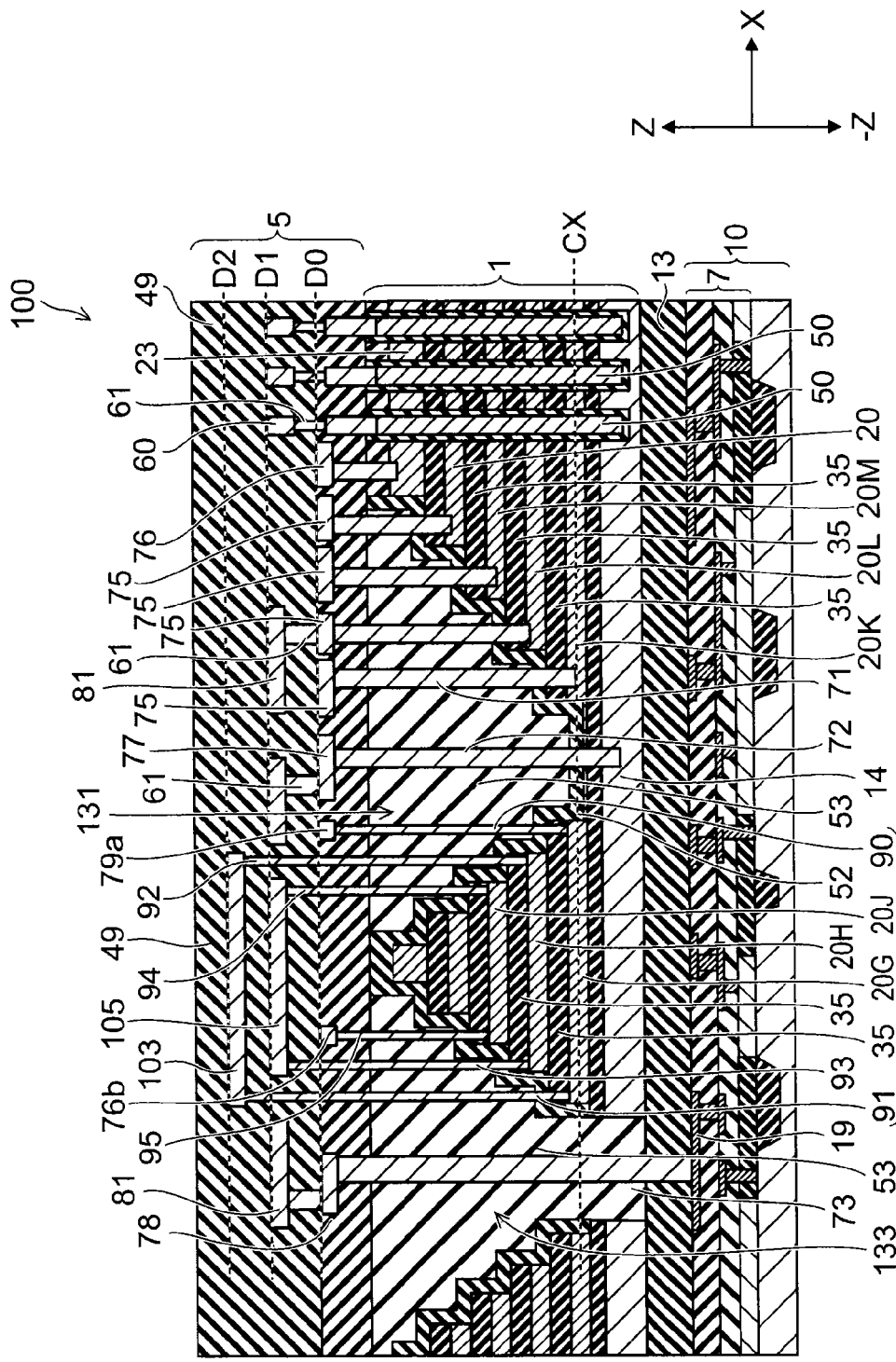
FIG. 2 is a schematic view showing another cross section of the non-volatile memory device according to the embodiment.

FIG. 2 is a schematic view showing another cross section of the non-volatile memory device 100 according to the embodiment.

The non-volatile memory device 100 includes a memory cell array 1 with a three-dimensional configuration, and a coil 2 provided closely to the memory cell array 1. FIG. 1 shows the cross section perpendicular to a word line 20, and FIG. 2 shows the cross section parallel to the extending direction of the word line 20.

The memory cell array 1 is provided above an underlying layer (e.g., substrate 10). The memory cell array 1 includes a plurality of memory cells MC aligned in a first direction (Z-direction) perpendicular to the substrate 10, and first interconnections (hereinafter, each referred to as word line 20). A word line 20 extends in a second direction (X-direction) perpendicular to the first direction, and controls the operation of one of the plurality of memory cells MC.

The coil 2 includes a second interconnection (interconnection 20G), a third interconnection (interconnection 103), a first plug (plug 91), and a second plug (plug 92) as one winding. The interconnection 20G extends in the X-direction, and shares a central axis in the X-direction with a word line 20K. That is, the extension of the interconnection 20G in the X-direction overlaps the word line 20K. The plug 91 extends in the Z-direction, and has a first end connected to the interconnection 20G. The interconnection 103 is electrically connected to a second end of the plug 91, and extends in a direction parallel to the substrate 10. The plug 92 has a first end electrically connected to the interconnection 103, and extends in a −Z-direction opposite to the Z-direction.

Referring to FIGS. 1 and 2, the configuration of the non-volatile memory device 100 is described in detail below. While the following description discusses a NAND flash memory as an example of the non-volatile memory device 100, the embodiment is not limited to this configuration. For example, the configuration may have a cross-point memory cell array.

In the following description, the first direction is taken to be the Z-direction, the second direction perpendicular to the first direction is taken to be the X-direction, and a third direction perpendicular to the first and second directions is taken to be a Y-direction. It should be noted that the Z-direction may be expressed as upward, and the −Z-direction may be expressed as downward.

The non-volatile memory device 100 includes the memory cell array 1 provided on the substrate 10, an interconnection section 5 provided on the memory cell array 1, and a circuit 7 provided on the substrate 10. The circuit 7 controls the operation of the memory cell array 1 via the interconnection section 5.

As shown in FIG. 1, the memory cell array 1 is provided on the substrate 10 via an interlayer insulating film 13. The memory cell array 1 includes a conductive layer 14 provided on the interlayer insulating film 13, a plurality of word lines 20 stacked on the conductive layer 14, and selection gate electrodes 23 provided on the word lines 20.

An insulating layer 31 is provided between the conductive layer 14 and the word lines 20. Insulating layers 35 are provided between the word lines 20 stacked in the Z-direction, respectively. Insulating layers 37 are provided between the word lines 20 and the selection gate electrode 23. Each word line 20 includes, for example, polycrystalline silicon. The insulating layers 31, 35 and 37 include at least one of, for example, a silicon oxide film and a silicon nitride film.

The word lines 20 are also juxtaposed in the Y-direction. Insulating films 43 are provided between the adjacent word lines 20 in the Y-direction, respectively. The selection gate electrodes 23 provided on the word lines 20 are juxtaposed in the Y-direction. Insulating films 45 are provided between the adjacent selection gate electrodes 23 in the Y-direction, respectively.

The word line 20 includes silicide at an end portion 20a contiguous to the insulating film 43. The selection gate electrode 23 includes silicide at an end portion 23a contiguous to the insulating film 45. Accordingly, the resistances of the word line 20 and the selection gate electrode 23 are reduced.

The memory cell array 1 further includes semiconductor layers 30 extending in the Z-direction, link parts 33, and memory films 40. The semiconductor layers 30 pass through the plurality of word lines 20 and the selection gate electrodes 23 in the Z-direction. The link part 33 extending in the Y-direction is provided between the conductive layer 14 and the word lines 20. The link part 33 electrically connects two semiconductor layers 30 respectively passing through the adjacent word lines 20 in the Y-direction.

The memory film 40 is provided between the word line 20 and the semiconductor layer 30. The memory film 40 is, for example, a multilayer film including a silicon oxide film and a silicon nitride film, and is capable of storing charges supplied from the semiconductor layer 30. That is, the memory cells MC are provided between the semiconductor layer 30 and the word line 20 via the memory film 40. A plurality of memory cells aligned in the extending direction (Z-direction) of the semiconductor layer 30 is provided.

The memory film 40 is provided to have such a thickness as to serve as a gate insulating film. A selection transistor SG is formed between the semiconductor layer 30 and the selection gate electrode 23 that face each other via the memory film 40. The conductive layer 14 covers the bottom face and the side surface of the link part 33 via the memory film 40, and serves as a back gate.

The two semiconductor layers 30 passing through the adjacent word lines 20 this way are electrically connected by the link part 33 to form a NAND string 50 including the plurality of memory cells (MC) and the selection transistors SG provided on both sides of the memory cells.

The interconnection section 5 includes bit lines 60 and source lines 80. The bit line 60 and the source line 80 are electrically connected to the semiconductor layer 30 via plugs 61 and 82, respectively. In other words, the bit line 60 and the source line 80 are electrically connected to both ends of the NAND string 50. The bit line 60 and the source line 80 are electrically insulated from each other by an interlayer insulating film 49.

The non-volatile memory device 100 includes a plurality of NAND strings 50 that are juxtaposed in the X-direction and the Y-direction. Accordingly, the layout of the memory cells MC and the word lines 20 has a three-dimensional configuration.

As shown in FIG. 2, a first recessed portion (hereinafter, recessed portion 131) is provided at an end of the memory cell array 1. The recessed portion 131 has a step-like wall face exposing the end of each of the plurality of word lines 20.

Further, a second recessed portion (hereinafter, recessed portion 133) is provided at a peripheral portion surrounding the memory cell array 1. The recessed portion 133 includes a contact plug that electrically connects a control line included in the interconnection section 5, and the circuit 7. The recessed portion 133 has a step-like wall face.

The coil 2 is provided between the recessed portion 131 and the recessed portion 133. That is, an interconnection 20G is provided between the recessed portion 131 and the recessed portion 133. The recessed portion 131 has a wall face from which a first end of the interconnection 20G is extended. The recessed portion 133 has a wall face from which a second end of the interconnection 20G is extended.

The coil 2 includes an interconnection 20H (fourth interconnection) stacked above the interconnection 20G, and an interconnection 20J. The interconnections 20H and 20J both extend in the X-direction. Each of the interconnections 20H and 20J shares a central axis CX in the X-direction with one of the plurality of word lines 20. That is, the interconnections 20H and 20J share a central axis in the X-direction with word lines 20L and 20M different from a word line 20K that shares the central axis CX with the interconnection 20G. The word lines 20L and 20M control respective memory cells MC different from those in the memory cells MC aligned in the Z-direction which are controlled by the word line 20K.

The interconnection 20H is connected to the second end of the plug 92. The coil 2 further includes the interconnection 20H, a plug 93 (third plug), an interconnection 105 (fifth interconnection), and a plug 94 (fourth plug) as one winding. The plug 93 extends in the Z-direction, and has a first end connected to the interconnection 20H. The interconnection 105 is electrically connected to a second end of the plug 93, and extends in the direction parallel to the substrate 10. The plug 94 has a first end electrically connected to the interconnection 105, and extends in the −Z-direction opposite to the Z-direction.

First ends of the interconnections 20G, 20H and 20J extend in a step-like form from a first wall face of the recessed portion 131. Ends of a plurality of word lines 20 extend in a step-like form from a second wall face of the recessed portion 131 opposite to the first wall face of the recessed portion 131 from which the interconnections 20G, 20H and 20H are extended. Second ends of the interconnections 20G, 20H and 20J extend in a step-like form from the recessed portion 133.

An insulating film 53 is embedded within the inside of each of the recessed portions 131 and 133. The interconnection section 5 is provided so as to cover the recessed portions 131 and 133. The interconnection section 5 includes the interconnection 103, the interconnection 105, control lines 75 to 78, and an interconnection 79.

The interconnection section 5 is, for example, a three-layer interconnection having a D0 layer, a D1 layer and a D2 layer.

The interconnection 103 is provided on, for example, the D2 layer, and extends in the X-direction. The interconnection 103 has a first end located on the recessed portion 131, and a second end located on the recessed portion 133. The interconnection 105 is provided on the D1 layer underlying the D2 layer, and extends in the X-direction. The interconnection 105 has a first end located on the recessed portion 131, and a second end located on the recessed portion 133. The interconnections 103 and 105 include, for example, tungsten (W), and are insulated from each other by the insulating film 49.

The recessed portion 131 includes plugs 71, 72, 90, 92 and 94. The plug 71 (fifth plug) electrically connects between an end portion of the word line 20 and the control line 75, and between the selection gate electrode 23 and the control line 76. The plug 72 electrically connects the conductive layer 14 and the control line 77. The plug 90 electrically connects an end portion of the interconnection 20G and an interconnection 79a. The plug 92 electrically connects a first end of the interconnection 103 and an end portion of the interconnection 20H. The plug 94 electrically connects a first end of the interconnection 105 and an end portion of the interconnection 20J.

The recessed portion 133 includes plugs 73, 91, 93 and 95. The plug 73 (sixth plug) electrically connects a terminal 19 of the circuit 7 and the control line 78. The plug 91 electrically connects a second end of the interconnection 103 and an end portion of the interconnection 20G. The plug 93 electrically connects a second end of the interconnection 105 and the end portion of the interconnection 20H. The plug 95 electrically connects the end portion of the interconnection 20J and an interconnection 79b.

As apparent from the above, the word line 20, the selection gate electrode 23 and the conductive layer 14 (back gate) are electrically connected to the respective control lines 75 to 77 by each of the plugs provided at the recessed portion 131. The plug 73 provided at the recessed portion 133 electrically connects the circuit 7 provided on the substrate 10 and the control line 78. The control lines 75 to 78 are provided on, for example, the D0 layer. The control lines 75 to 78 are electrically connected to an interconnection 81 provided on the D1 layer overlying the D0 layer. The interconnection 81 may be connected as needed to supply signals to the word lines 20 from the circuit 7 via the control line 75. The interconnection 79 electrically connects the coil 2 to the circuit 7, for example, so that the coil serves as an antenna for transmitting and receiving high-frequency signals.

Figure 3A:
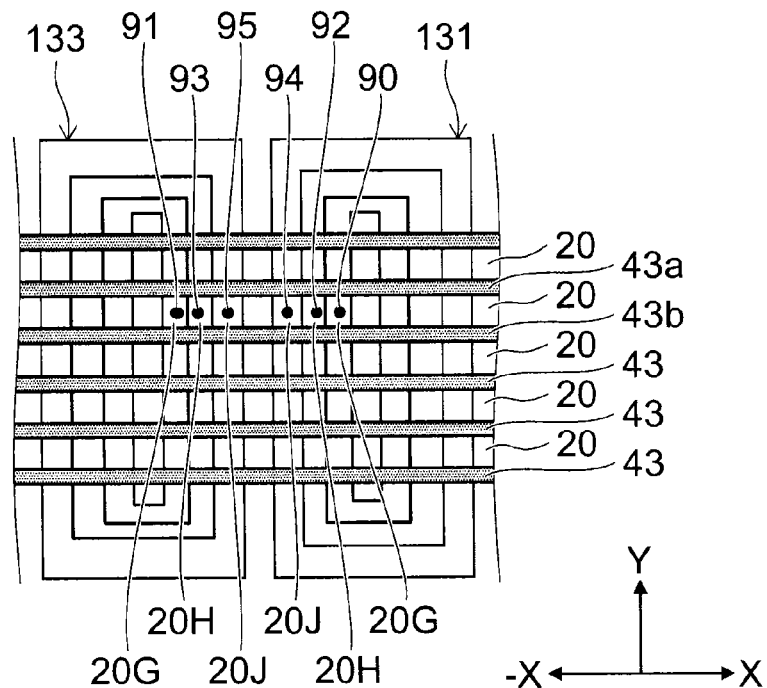
FIGS. 3A and 3B are schematic views showing the coil according to the embodiment.
Figure 3B:
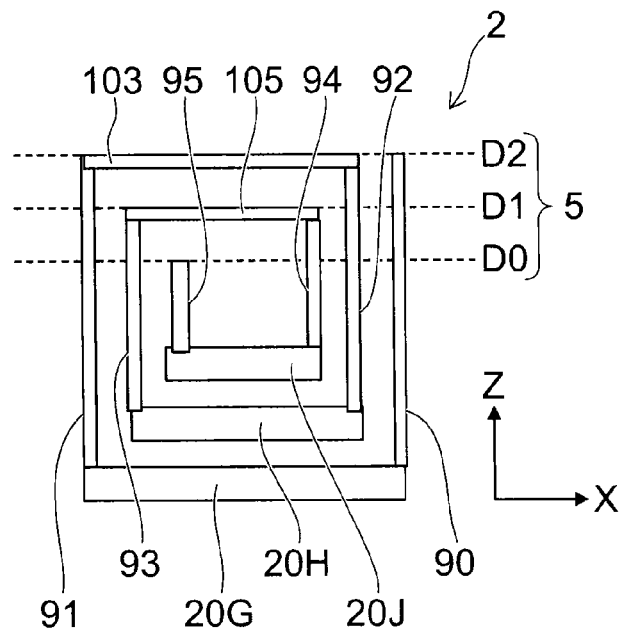

FIGS. 3A and 3B are schematic views showing the coil 2 according to the embodiment. FIG. 3A is a plan view showing the recessed portions 131 and 133 as viewed from above. FIG. 3B is a schematic view showing the structure of the coil 2 as viewed in the Y-direction.

As shown in FIG. 3A, the insulating film 43 provided between the adjacent word lines 20 extends in an −X-direction, and is also provided at the recessed portions 131 and 133. In the embodiment, the interconnections 20G, 20H and 20J are stacked in the named order between adjacent insulating films 43a and 43b. The plugs 90, 92 and 94 are respectively connected to the end portions of the interconnections 20G, 20H and 20J extending to the recessed portion 131. The plugs 91, 93 and 95 are respectively connected to the end portions of the interconnections 20G, 20H and 20J extending to the recessed portion 133.

As shown in FIG. 3B, the coil 2 includes one winding including the interconnection 20G, the plug 91, the interconnection 103 and the plug 92, and another winding including the interconnection 20H, the plug 93, the interconnection 105 and the plug 94 within the same plane.

Although the interconnection section 5 is shown to include three interconnections according to the embodiment, the number of the interconnections may be increased. This variation can increase the number of windings included within the same X-Z plane. That is, the coil 2 includes at least two windings included in a plane perpendicular to the substrate 10.

Next, a method of manufacturing the non-volatile memory device 100 is described referring to FIGS. 4 to 9. FIGS. 4A to 9B are schematic views showing the process of manufacturing the non-volatile memory device 100 according to the embodiment. FIGS. 4A and 5A are schematic views showing the top surface of a wafer around a region where the memory cell array 1 is provided. FIGS. 4B, 5B, and 6A to 9B are schematic views each showing a partial cross section of the wafer. In the following description, the substrate 10 during the process of manufacturing the memory cell array 1 may be referred to as wafer.

Figure 4A:
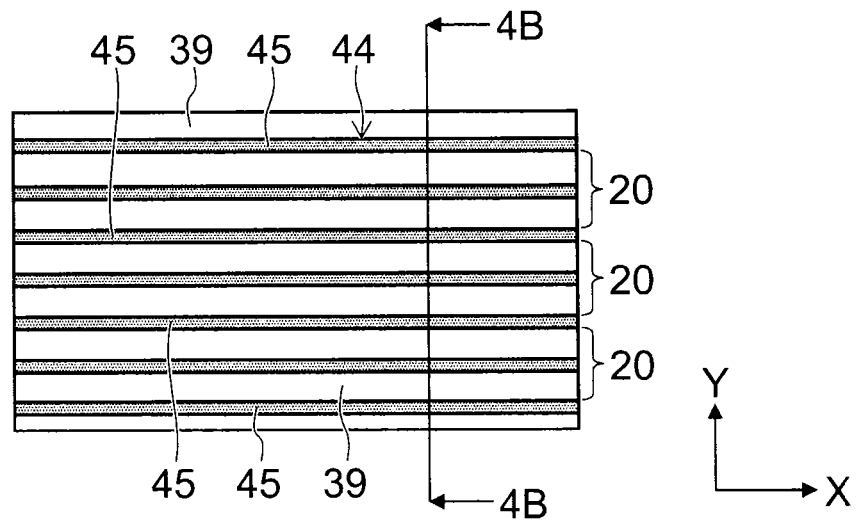
FIGS. 4A and 4B are schematic views showing the process of manufacturing the non-volatile memory device according to the embodiment.
Figure 4B:
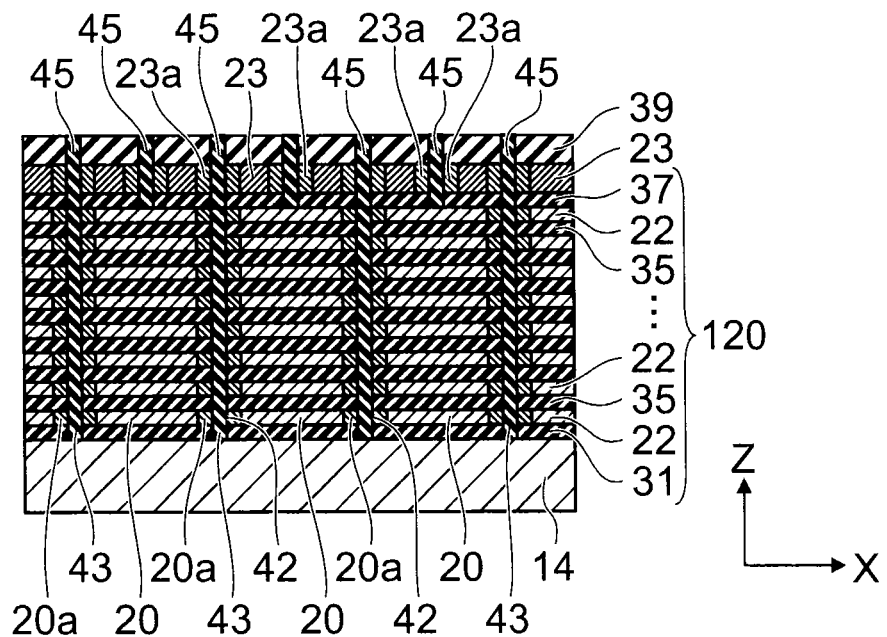

As shown in FIGS. 4A and 4B, a plurality of word lines 20 and selection gate electrodes 23 are formed on the conductive layer 14. FIG. 4B shows the cross section along line 4B-4B in FIG. 4A.

First, a stacked body 120 formed on the conductive layer 14 is segmented to form a plurality of word lines 20. The stacked body 120 includes an insulating layer 31 formed on the conductive layer 14, conductive layers 22 and insulating layers 35 alternately stacked on the insulating layer 31, and an insulating layer 37 provided on the conductive layers 22. Each conductive layer 22 is, for example, a polycrystalline silicon layer, and each of the insulating layers 31, 35 and 37 is, for example, a silicon oxide film.

The stacked body 120 is segmented into a plurality of word lines 20 by a plurality of grooves (slits 42) extending in the X-direction. The word lines 20 are formed in stripes extending in the X-direction. The insulating film 43 is embedded within the inside of the slit 42. Further, the conductive layer and the insulating layer 39 provided on the insulating layer 37 are segmented by grooves 44 to form the selection gate electrodes 23. Then, the insulating film 45 is formed inside the groove 44. At this time, the semiconductor layer 30, the link parts 33, and the selection gate electrodes 23 are formed in the region where the memory cell array 1 is provided.

Further, an end portion 20a of the word line 20 contiguous to the insulating film 43 and an end portion 23a of the selection gate electrode 23 contiguous to the insulating film 45 include silicide. For example, a metal film of nickel (Ni) or cobalt (Co) is formed on the end face of the word line 20 that is exposed to a side wall of the slit 42 and on the end face of the selection gate electrode 23 that is exposed to a side wall of the groove 44 in a previous stage of the process shown in FIGS. 4A and 4B. Subsequently, the wafer is subjected to a heat treatment to make the end portion 20a of the word line 20 and the end portion 23a of the selection gate electrode 23 silicided.

Figure 5A:
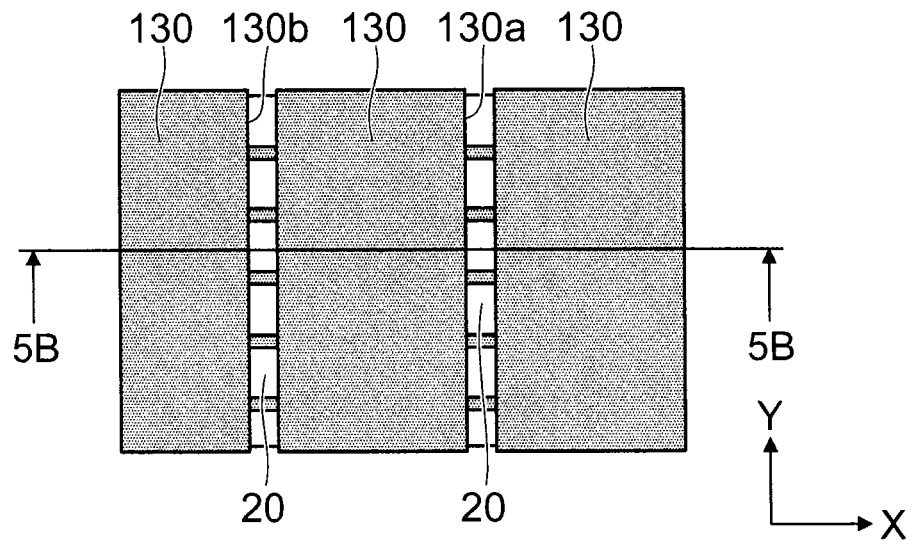
FIGS. 5A and 5B are schematic cross-sectional views showing the manufacturing process subsequent to FIG. 4B.
Figure 5B:
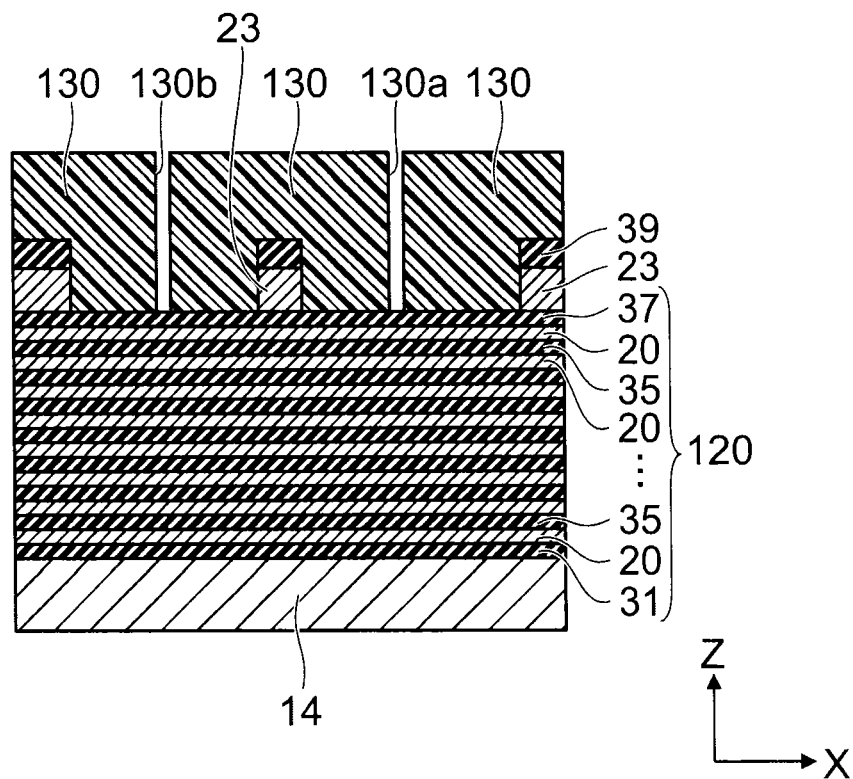

Next, as shown in FIGS. 5A and 5B, a mask 130 for etching the recessed portions 131 and 133 is formed. FIG. 5B shows the cross section along line 5B-5B shown in FIG. 5A.

First, the insulating layer 39 and the selection gate electrode 23 at regions where the recessed portions 131 and 133 are formed are removed. Then, for example, a resist film serving as the mask 130 is applied onto the wafer, and openings 130a and 130b are formed in stripes in the recessed portion 131 using photolithography. The mask 130 has the opening 130a in the region where the recessed portion 131 is formed, and the opening 130b in the region where the recessed portion 133 is formed.

Figure 6A:
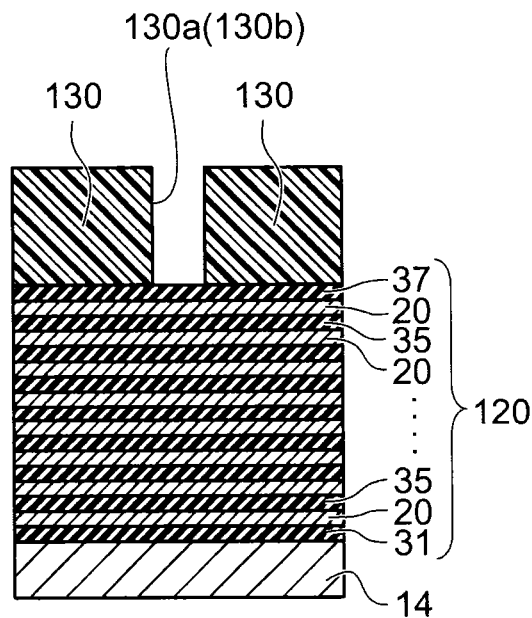
FIGS. 6A and 6B are schematic cross-sectional views showing the manufacturing process subsequent to FIG. 5B.
Figure 6B:
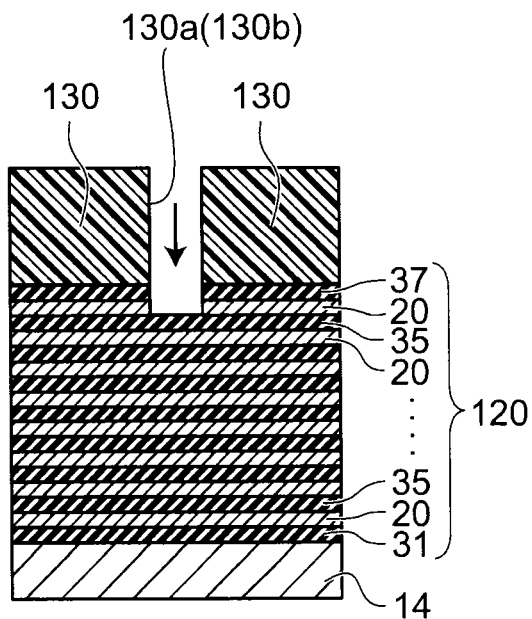

Next, as shown in FIGS. 6A and 6B, the insulating layer 37 exposed to the bottom faces of the openings 130a and 130b is etched (first step). Then, the word line 20 exposed after the etching of the insulating layer 37 is etched (second step).

It is favorable that the etching of the insulating layer 37 is performed under an etching condition such that the word line 20 is not etched, or such that the speed of etching the word line 20 is slower than the speed of etching the insulating layer 37. It is also favorable that the etching of the word line 20 is performed under an etching condition such that the underlying insulating layer 35 is not etched, or such that the speed of etching the insulating layer 35 is slower than the speed of etching the word line 20. In other words, it is desirable to use an etching condition that selective etching is performed on each underlying layer.

Figure 7A:
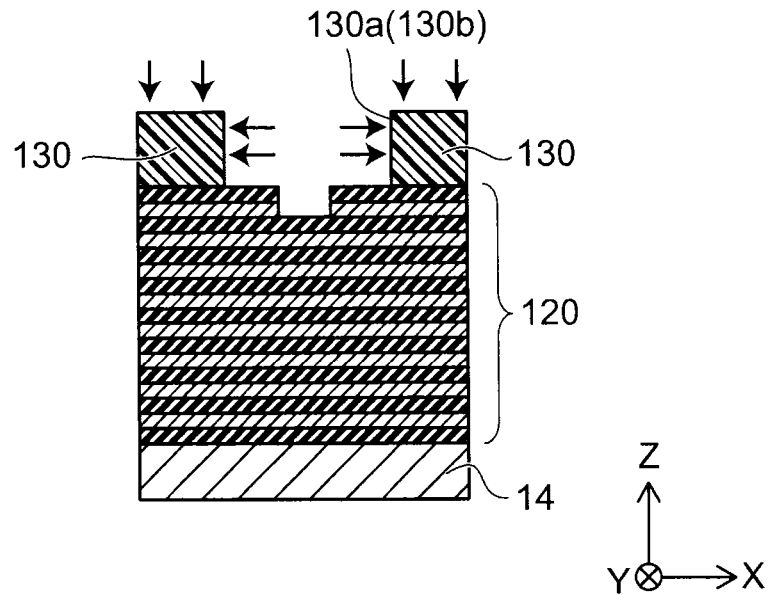
FIGS. 7A and 7B are schematic cross-sectional views showing the manufacturing process subsequent to FIG. 6B.

Next, as shown in FIG. 7A, the mask 130 is isotropically etched to widen the openings 130a and 130b (third step). When the mask 130 is a resist film, the mask may be etching by, for example, ashing using oxygen plasma. The amount of the mask 130 to be etched in the X-direction and in the −X-direction is set to a width that permits the plug 71 to contact the end of the word line 20.

Figure 7B:
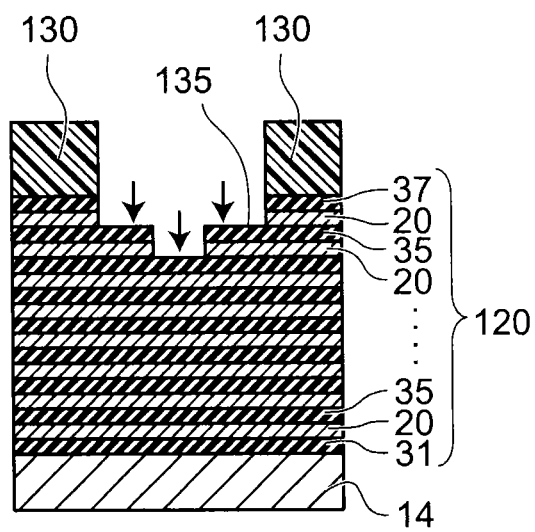

Next, as shown in FIG. 7B, the insulating layers 35 respectively exposed to the bottoms of the widened openings 130a and 130b are etched (first step). Then, the word line 20 exposed after the etching of the insulating layer 35 is etched (second step). As a result, an etching hole is formed in the bottom face of each of the openings 130a and 130b. A step 135 which the plug 71 may contact is formed at the side wall of the etching hole. Subsequently, the mask 130 is isotropically etched to make the openings 130a and 130b further wider (third step).

Figure 8A:
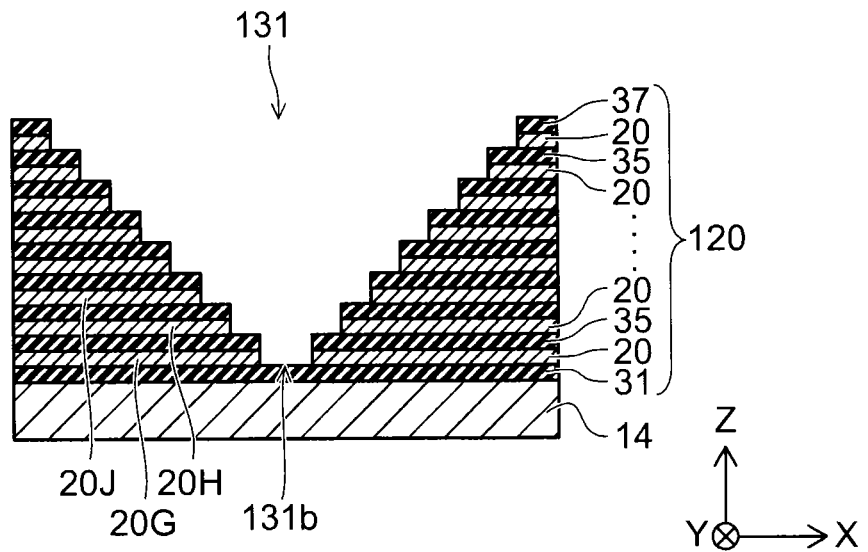
FIGS. 8A and 8B are schematic cross-sectional views showing the manufacturing process subsequent to FIG. 7B.

As shown in FIG. 8A, the recessed portion 131 may be formed by repeating the aforementioned first to third steps. As shown in FIG. 8A, the end portions of the interconnections 20G, 20H and 20J extend in a step-like form at a first wall face of the recessed portion 131. The end portions of the word lines 20 extend in a step-like form at a second wall face of the recessed portion 131. The recessed portion 133 is formed in a similar manner. The interconnections 20G, 20H and 20J are formed by segmenting the word lines 20 by the recessed portion 131.

Figure 8B:
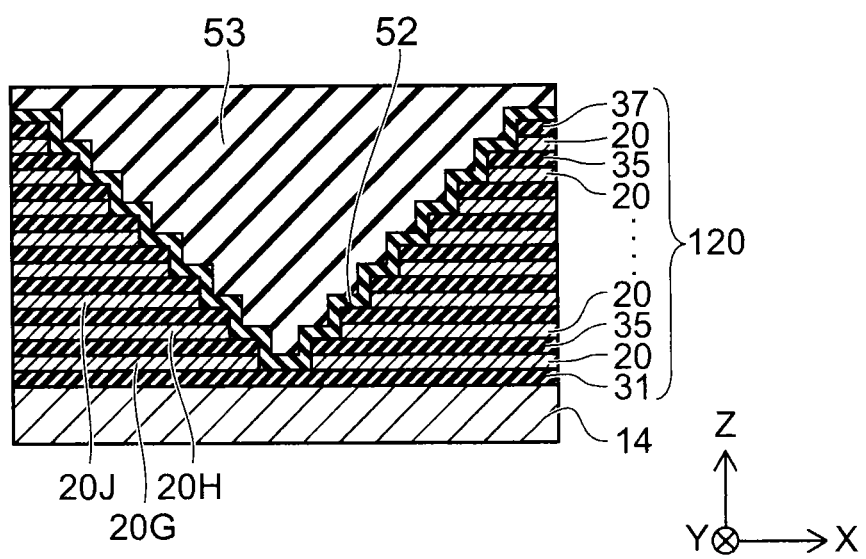

Subsequently, as shown in FIG. 8B, an insulating layer 52 covering the inner surfaces of the recessed portions 131 and 133 is formed. Further, an insulating film 53 filling the recessed portions 131 and 133 is formed.

Figure 9A:
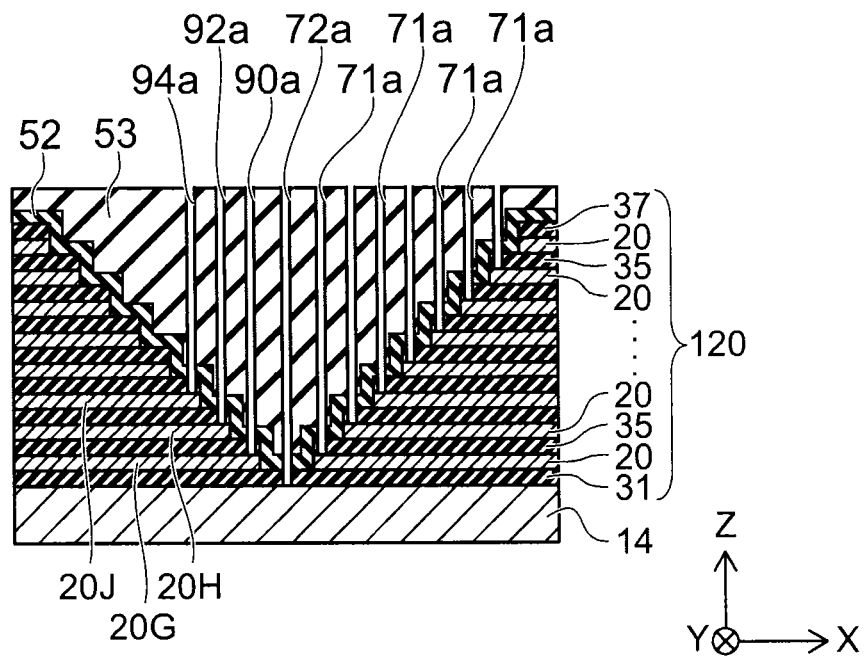
FIGS. 9A and 9B are schematic cross-sectional views showing the manufacturing process subsequent to FIG. 8B.

Next, as shown in FIG. 9A, contact holes 71a, 90a, 92a and 94a passing through the insulating film 53, the insulating layer 52 and the insulating layer 35 from the top surface of the insulating film 53, and respectively reaching the end portion of the word line 20 and the end portions of the interconnections 20G, 20H and 20J are formed. A contact hole 72a passing through, from the top surface of the insulating film 53, the insulating film 53 and the insulating layers 52 and 31 formed in the bottom face of the recessed portion 131, and reaching the conductive layer 14 is provided.

Figure 9B:
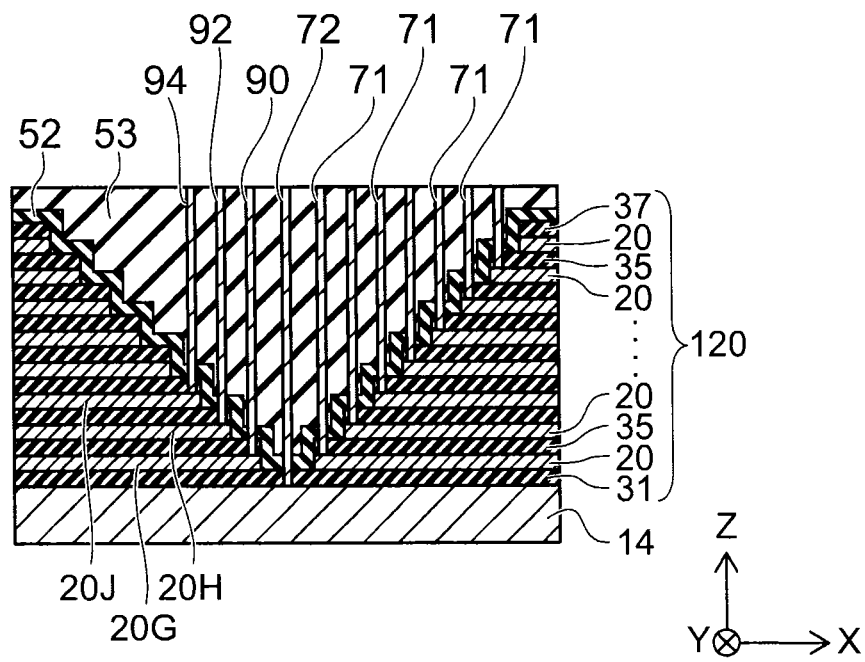

Then, as shown in FIG. 9B, the plugs 71, 72, 90, 92 and 94 filling the inside of the respective contact holes are formed. Each plug includes, for example, tungsten (W). The plugs 91, 93 and 95 that contact the second end portions of the interconnections 20G, 20H and 20J are likewise formed at the recessed portion 133. The plug 73 is formed at the recessed portion 133 to be connected to the terminal 19 of the circuit 7. Further, the interconnection section 5 is formed on the insulating film 53, thereby completing the non-volatile memory device 100.

Figure 10A:
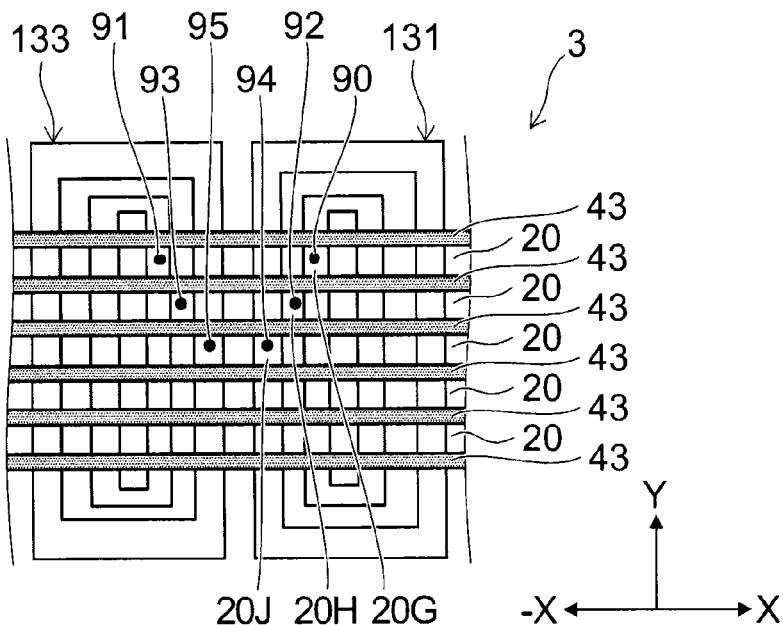
FIGS. 10A to 10C are schematic views showing a coil according to a variation of the embodiment.
Figure 10B:
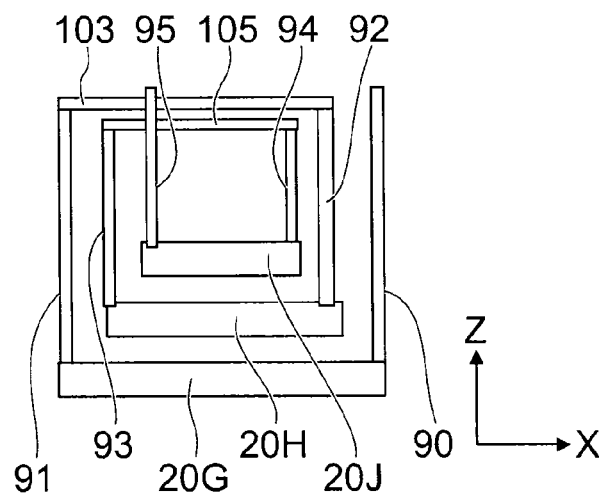
Figure 10C:
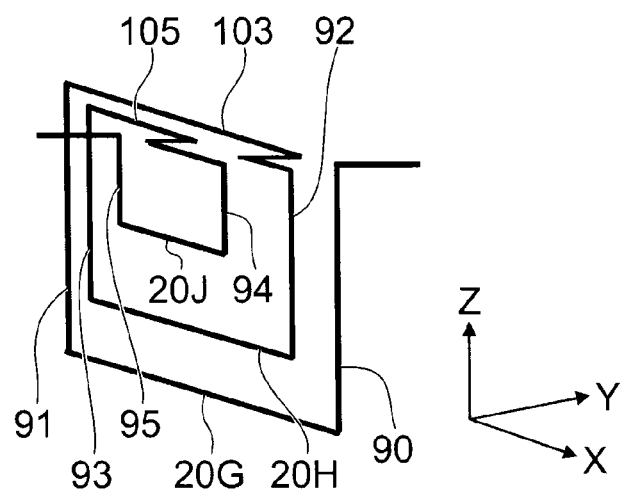

FIGS. 10A to 10C are schematic views showing a coil 3 according to a variation of the embodiment. FIG. 10A is a plan view showing the recessed portions 131 and 133 as viewed from above. FIG. 10B is a schematic view showing the configuration of the coil 3 as viewed in the Y-direction. FIG. 10C is a perspective view showing the coil 3.

As shown in FIGS. 10A and 10B, the plugs 90 and 91 are connected to both ends of the interconnection 20G respectively extending to both of the recessed portions 131 and 133. The plugs 92 and 93 are connected to both ends of the interconnection 20H juxtaposed obliquely above the interconnection 20G. The plugs 94 and 95 are connected to both ends of the interconnection 20J juxtaposed obliquely above the interconnection 20H.

As shown in FIG. 10C, the interconnections 103 and 105 are provided on the same layer, for example, the D0 layer. The interconnection 103 is electrically connected to the plugs 91 and 92. The interconnection 105 is electrically connected to the plugs 93 and 94.

In this variation, the interconnection 20G, the plug 91, the interconnection 103, and the plug 92 form a single winding. The interconnection 20H, the plug 93, the interconnection 105, and the plug 94 form another winding connected to the plug 92. The interconnections 103 and 105 may be provided on different layers, respectively. For example, the interconnection 103 may be provided on the D1 layer, and the interconnection 105 may be provided on the D0 layer.

Figure 11A:
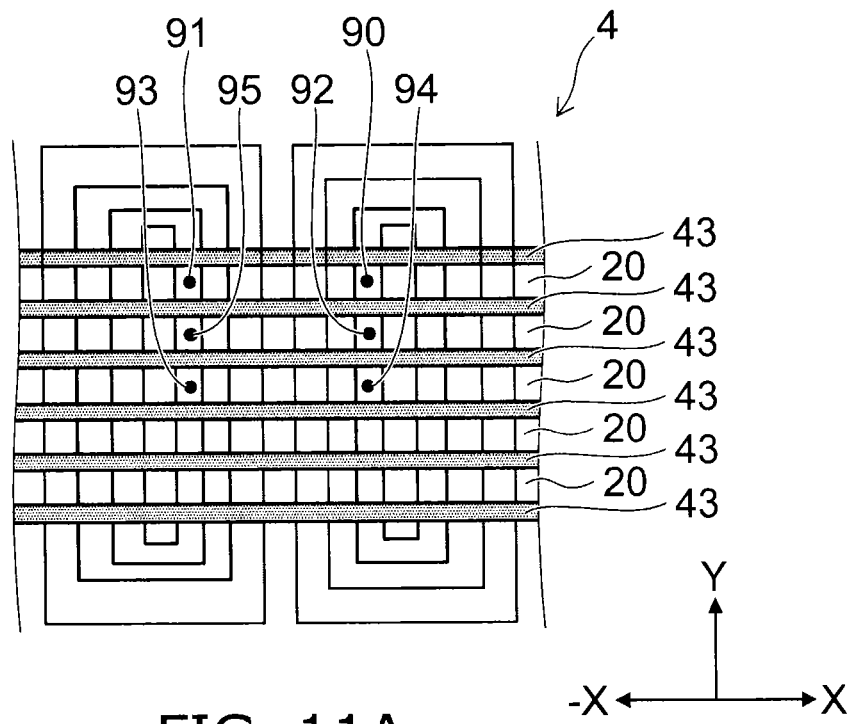
FIGS. 11A and 11B are schematic views showing a coil according to another variation of the embodiment.
Figure 11B:
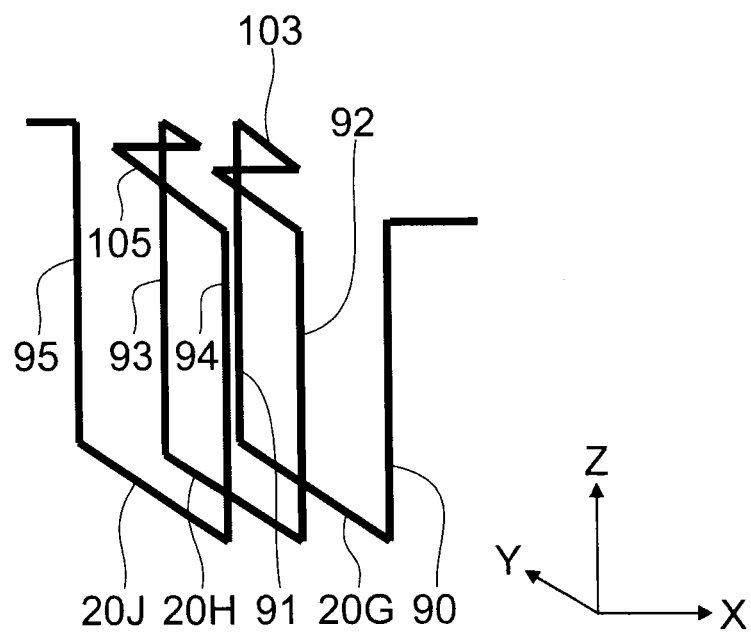

FIGS. 11A and 11B are schematic views showing a coil 4 according to another variation of the embodiment. FIG. 11A is a plan view showing the recessed portions 131 and 133 as viewed from above. FIG. 11B is a perspective view showing the coil 4.

As shown in FIG. 11A, the plugs 90 and 91 are connected to both ends of the interconnection 20G respectively extending to both of the recessed portions 131 and 133. The plugs 92 and 93 are connected to both ends of the interconnection 20H juxtaposed with the interconnection 20G in the −Y-direction. The plugs 94 and are connected to both ends of the interconnection 20J juxtaposed with the interconnection 20H in the −Y-direction.

As shown in FIG. 11B, the interconnections 103 and 105 are provided on the same layer, for example, the D0 layer. The interconnection 103 is electrically connected to the plugs 91 and 92. The interconnection 105 is electrically connected to the plugs 93 and 94.

In this variation, the interconnection 20G, the plug 91, the interconnection 103, and the plug 92 form a single winding. The interconnection 20H, the plug 93, the interconnection 105, and the plug 94 form another winding connected to the plug 92.

As apparent from the above, the embodiment provides the non-volatile memory device 100 including the coil 2, 3 or 4. The non-volatile memory device 100 includes a memory cell array with a three-dimensional configuration, and includes a plurality of word lines 20 laid out three-dimensionally. Each of the coils 2 to 4 has a rotational surface perpendicular to the underlying layer (substrate 10), and includes a portion of the word lines 20. This configuration can reduce the area of the surface of the chip that is occupied by the coil (inductor).

Each of the coils 2 to 4 may be formed using the recessed portion 131 that electrically connects the word lines 20 to the interconnection section 5, and the recessed portion 133 that electrically connects the circuit 7 for driving the memory cell array 1 to the interconnection section 5. This is also advantageous in that an additional process of forming the coil 2, 3 or 4 is not needed.

Because the windings of the coil 2 can be provided within the same plane, the area of the chip surface that is occupied by the coil 2 can be minimized. With regard to the coil 4, the area of the rotational surface can be maximized. For example, the configurations of the coils 2 to 4 may be adequately combined to obtain a coil having a desired performance.

The use of each of the coils 2 to 4 can significantly reduce the area of the surface of the chip that is occupied by the coil compared to the coil having a rotational surface parallel to the underlying layer. In other words, a large inductor can be provided in a minute region in the surface of a chip. This can downsize the non-volatile memory device 100, and can increase the storage capacity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
a memory cell array; and
a coil provided closely to the memory cell array,
the memory cell array including
a plurality of memory cells provided above an underlying layer, the memory cells being aligned in a first direction perpendicular to the underlying layer, and
at least one first interconnection extending in a second direction perpendicular to the first direction, the first interconnection configured to control an operation of one of the memory cells,
the coil including at least one winding,
the winding including
a second interconnection extending in the second direction and sharing a central axis in the second direction with the first interconnection,
a first plug extending in the first direction and having one end connected to the second interconnection,
a third interconnection electrically connected to another end of the first plug and extending in a direction parallel to the underlying layer, and
a second plug having one end electrically connected to the third interconnection, and extending in a direction opposite to the first direction.

2. The device according to claim 1, wherein the coil further includes at least one winding including
a fourth interconnection juxtaposed with the second interconnection and extending in the second direction, the fourth interconnection being connected to another end of the second plug,
a third plug extending in the first direction and having one end connected to the fourth interconnection,
a fifth interconnection electrically connected to another end of the third plug and extending in the direction parallel to the underlying layer, and
a fourth plug having one end electrically connected to the fifth interconnection, and extending in the direction opposite to the first direction.

3. The device according to claim 2, wherein the memory cell array further includes another memory cell juxtaposed with the one of the memory cells and another first interconnection extending in the second direction and configured to control an operation of the another memory cell, and
the fourth interconnection shares the central axis in the second direction with another first interconnection.

4. The device according to claim 2, wherein the third interconnection and the fifth interconnection are provided within a plane parallel to the underlying layer.

5. The device according to claim 4, further comprising:
a first recessed portion having a wall face from which one end portion of the second interconnection and one end portion of the fourth interconnection are extended; and
a second recessed portion having a wall face from which another end portion of the second interconnection and another end portion of the fourth interconnection are extended,
the first plug being connected to the another end portion of the second interconnection at the second recessed portion,
the second plug being connected to the one end portion of the fourth interconnection at the first recessed portion, and
the third plug being connected to another end portion of the fourth interconnection at the second recessed portion.

6. The device according to claim 5, wherein the first interconnection extends, at the first recessed portion, from a wall face facing the wall face from which the second interconnection and the fourth interconnection extend.

7. The device according to claim 5, further comprising: an interconnection section provided on the memory cell array, and including a control line configured to supply a signal to the first interconnection, the third interconnection, and the fifth interconnection.

8. The device according to claim 7, wherein the first recessed portion includes a fifth plug electrically connecting the first interconnection and the control line.

9. The device according to claim 7, wherein the underlying layer includes a circuit configured to control an operation of the memory cell array, and
the second recessed portion includes a sixth plug electrically connecting the circuit and the control line.

10. The device according to claim 2, wherein the first interconnection, the second interconnection, and the fifth interconnection include a same material.

11. The device according to claim 2, wherein the third interconnection and the fifth interconnection include a same material.

12. The device according to claim 8, wherein the first plug, the second plug, the third plug, the fourth plug, and the fifth plug include a same material.

13. The device according to claim 1, wherein the coil further includes at least one winding including
a fourth interconnection stacked above the second interconnection and extending in the second direction, the fourth interconnection being connected to another end of the second plug;
a third plug extending in the first direction and having one end connected to the fourth interconnection;
a fifth interconnection electrically connected to another end of the third plug and extending in the direction parallel to the underlying layer; and
a fourth plug having one end electrically connected to the fifth interconnection, and extending in the direction opposite to the first direction.

14. The device according to claim 13, wherein the memory cell array further includes another first interconnection configured to control an operation of another one of the memory cells, and the fourth interconnection shares a central axis in the second direction with another first interconnection.

15. The device according to claim 13, wherein at least two windings included in the coil are disposed in a plane perpendicular to the underlying layer, the plane including the second interconnection.

16. The device according to claim 2, wherein the memory cell array includes a plurality of the first interconnections stacked in the first direction, a semiconductor layer piercing the first interconnections in the first direction, and a memory film provided between each of the first interconnections and the semiconductor layer.

17. The device according to claim 16, wherein each of the first interconnections, the second interconnection, and the fourth interconnection includes polycrystalline silicon.

18. The device according to claim 16, wherein each of the first interconnections, the second interconnection, and the fourth interconnection includes silicide.

19. The device according to claim 16, wherein each of the third interconnection and the fifth interconnection includes tungsten.

20. The device according to claim 8, wherein each of the first plug, the second plug, the third plug, the fourth plug, and the fifth plug includes tungsten.

* * * * *